(12) United States Patent
Lee et al.

(10) Patent No.: US 11,489,534 B1
(45) Date of Patent: Nov. 1, 2022

(54) DIGITAL-TO-ANALOG CONVERSION ARCHITECTURE AND METHOD

(71) Applicant: Cirrus Logic International Semiconductor Ltd., Edinburgh (GB)

(72) Inventors: Seung Bae Lee, Austin, TX (US);
Sunny Bhagia, Austin, TX (US);
Jaiminkumar Mehta, Austin, TX (US);
Anindya Bhattacharya, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/498,183

(22) Filed: Oct. 11, 2021

(51) Int. Cl.
*H03M 1/06* (2006.01)
*H03M 1/08* (2006.01)

(52) U.S. Cl.
CPC ....... *H03M 1/0612* (2013.01); *H03M 1/0809* (2013.01); *H03M 1/0836* (2013.01)

(58) Field of Classification Search
CPC . H03M 1/0612; H03M 1/0809; H03M 1/0836
See application file for complete search history.

(56) References Cited

U.S. PATENT DOCUMENTS

| | | | | |
|---|---|---|---|---|
| 5,539,405 A * | 7/1996 | Norsworthy | .......... | H03M 1/685 341/144 |
| 6,014,038 A * | 1/2000 | How | ........................ | G06F 30/39 326/46 |
| 2007/0194962 A1 * | 8/2007 | Asayama | ............... | H04N 5/378 341/144 |
| 2008/0218496 A1 * | 9/2008 | Song | .................... | G09G 3/3688 345/204 |
| 2010/0271520 A1 * | 10/2010 | Nakayama | ............. | H04N 5/374 348/E5.091 |
| 2012/0305752 A1 * | 12/2012 | Shimizu | ............... | H04N 5/3765 250/208.1 |
| 2019/0205729 A1 * | 7/2019 | Tran | ....................... | G06N 3/063 |
| 2019/0235866 A1 * | 8/2019 | Das Sarma | ......... | G06F 9/30032 |
| 2019/0385680 A1 * | 12/2019 | Dunga | ................... | G11C 16/24 |

* cited by examiner

*Primary Examiner* — Lam T Mai
(74) *Attorney, Agent, or Firm* — Jackson Walker L.L.P.

(57) ABSTRACT

Digital-to-analog converter (DAC) architecture, comprising: a matrix DAC array comprising a plurality of cells arranged in a first dimension and a second dimension, each cell comprising a local decoder configured to transition the cell between at least two states; and decoding circuitry configured to: receive a digital input signal; and control the plurality of local decoders based on a received digital input signal, wherein each incremental change in the digital input signal results in a transition of a single cell of the plurality of cells such that the plurality of cells transition in sequence, the sequence of transitions of the plurality of cells defining a path through the DAC array; wherein when the path proceeds in the first dimension, the path proceeds to an adjacent cell of the plurality of cells at least 50% of the time; and wherein when the path proceeds in the second dimension, the path proceeds to an adjacent cell of the plurality of cells at least 50% of the time.

26 Claims, 12 Drawing Sheets

| No. | Input | | | | Output | | | | | | |
|---|---|---|---|---|---|---|---|---|---|---|---|
| | $D_4$ | $D_3$ | $D_2$ | $D_1$ | $CD_7$ | $CD_6$ | $CD_5$ | $CD_4$ | $CD_3$ | $CD_2$ | $CD_1$ |
| 0 | 0 | 0 | 0 | 0 | 0 | 0 | 0 | 0 | 0 | 0 | 0 |
| 1 | 0 | 0 | 0 | 1 | 0 | 0 | 0 | 0 | 0 | 0 | 1 |
| 2 | 0 | 0 | 1 | 0 | 0 | 0 | 0 | 0 | 0 | 1 | 1 |
| 3 | 0 | 0 | 1 | 1 | 0 | 0 | 0 | 0 | 1 | 1 | 1 |
| 4 | 0 | 1 | 0 | 0 | 0 | 0 | 0 | 1 | 1 | 1 | 1 |
| 5 | 0 | 1 | 0 | 1 | 0 | 0 | 1 | 1 | 1 | 1 | 1 |
| 6 | 0 | 1 | 1 | 0 | 0 | 1 | 1 | 1 | 1 | 1 | 1 |
| 7 | 0 | 1 | 1 | 1 | 1 | 1 | 1 | 1 | 1 | 1 | 1 |
| 8 | 1 | 0 | 0 | 0 | 1 | 1 | 1 | 1 | 1 | 1 | 1 |
| 9 | 1 | 0 | 0 | 1 | 0 | 1 | 1 | 1 | 1 | 1 | 1 |
| 10 | 1 | 0 | 1 | 0 | 0 | 0 | 1 | 1 | 1 | 1 | 1 |
| 11 | 1 | 0 | 1 | 1 | 0 | 0 | 0 | 1 | 1 | 1 | 1 |
| 12 | 1 | 1 | 0 | 0 | 0 | 0 | 0 | 0 | 1 | 1 | 1 |
| 13 | 1 | 1 | 0 | 1 | 0 | 0 | 0 | 0 | 0 | 1 | 1 |
| 14 | 1 | 1 | 1 | 0 | 0 | 0 | 0 | 0 | 0 | 0 | 1 |
| 15 | 1 | 1 | 1 | 1 | 0 | 0 | 0 | 0 | 0 | 0 | 0 |

Rows 0–7: 802
Rows 8–15: 804

Fig. 8

| No. | Input | | | Output | | | | | | |
|---|---|---|---|---|---|---|---|---|---|---|
|  | $D_6$ | $D_5$ | $D_4$ | $RD_7$ | $RD_6$ | $RD_5$ | $RD_4$ | $RD_3$ | $RD_2$ | $RD_1$ |
| 0 | 0 | 0 | 0 | 0 | 1 | 0 | 1 | 0 | 1 | 0 |
| 1 | 0 | 0 | 1 | 0 | 1 | 0 | 1 | 0 | 1 | 1 |
| 2 | 0 | 1 | 0 | 0 | 1 | 0 | 1 | 0 | 0 | 1 |
| 3 | 0 | 1 | 1 | 0 | 1 | 0 | 1 | 1 | 0 | 1 |
| 4 | 1 | 0 | 0 | 0 | 1 | 0 | 0 | 1 | 0 | 1 |
| 5 | 1 | 0 | 1 | 0 | 1 | 1 | 0 | 1 | 0 | 1 |
| 6 | 1 | 1 | 0 | 0 | 0 | 1 | 0 | 1 | 0 | 1 |
| 7 | 1 | 1 | 1 | 1 | 0 | 1 | 0 | 1 | 0 | 1 |

Fig. 9

| No. | Input (Gray code) | | | | Output | | | | | | |
|---|---|---|---|---|---|---|---|---|---|---|---|
| | $GC_4$ | $GC_3$ | $GC_2$ | $GC_1$ | $CD_7$ | $CD_6$ | $CD_5$ | $CD_4$ | $CD_3$ | $CD_2$ | $CD_1$ |
| 0 | 0 | 0 | 0 | 0 | 0 | 0 | 0 | 0 | 0 | 0 | 0 |
| 1 | 0 | 0 | 0 | 1 | 0 | 0 | 0 | 0 | 0 | 0 | 1 |
| 2 | 0 | 0 | 1 | 1 | 0 | 0 | 0 | 0 | 0 | 1 | 1 |
| 3 | 0 | 0 | 1 | 0 | 0 | 0 | 0 | 0 | 1 | 1 | 1 |
| 4 | 0 | 1 | 1 | 0 | 0 | 0 | 0 | 1 | 1 | 1 | 1 |
| 5 | 0 | 1 | 1 | 1 | 0 | 0 | 1 | 1 | 1 | 1 | 1 |
| 6 | 0 | 1 | 0 | 1 | 0 | 1 | 1 | 1 | 1 | 1 | 1 |
| 7 | 0 | 1 | 0 | 0 | 1 | 1 | 1 | 1 | 1 | 1 | 1 |
| 8 | 1 | 1 | 0 | 0 | 1 | 1 | 1 | 1 | 1 | 1 | 1 |
| 9 | 1 | 1 | 0 | 1 | 0 | 1 | 1 | 1 | 1 | 1 | 1 |
| 10 | 1 | 1 | 1 | 1 | 0 | 0 | 1 | 1 | 1 | 1 | 1 |
| 11 | 1 | 1 | 1 | 0 | 0 | 0 | 0 | 1 | 1 | 1 | 1 |
| 12 | 1 | 0 | 1 | 0 | 0 | 0 | 0 | 0 | 1 | 1 | 1 |
| 13 | 1 | 0 | 1 | 1 | 0 | 0 | 0 | 0 | 0 | 1 | 1 |
| 14 | 1 | 0 | 0 | 1 | 0 | 0 | 0 | 0 | 0 | 0 | 1 |
| 15 | 1 | 0 | 0 | 0 | 0 | 0 | 0 | 0 | 0 | 0 | 0 |

Fig. 12

| No. | Gray code Input | | | Output | | | | | | |
|---|---|---|---|---|---|---|---|---|---|---|
| | $GR_3$ | $GR_2$ | $GR_1$ | $RD_7$ | $RD_6$ | $RD_5$ | $RD_4$ | $RD_3$ | $RD_2$ | $RD_1$ |
| 0 | 0 | 0 | 0 | 0 | 1 | 0 | 1 | 0 | 1 | 0 |
| 1 | 0 | 0 | 1 | 0 | 1 | 0 | 1 | 0 | 1 | 1 |
| 2 | 0 | 1 | 1 | 0 | 1 | 0 | 1 | 0 | 0 | 1 |
| 3 | 0 | 1 | 0 | 0 | 1 | 0 | 1 | 1 | 0 | 1 |
| 4 | 1 | 1 | 0 | 0 | 1 | 0 | 0 | 1 | 0 | 1 |
| 5 | 1 | 1 | 1 | 0 | 1 | 1 | 0 | 1 | 0 | 1 |
| 6 | 1 | 0 | 1 | 0 | 0 | 1 | 0 | 1 | 0 | 1 |
| 7 | 1 | 0 | 0 | 1 | 0 | 1 | 0 | 1 | 0 | 1 |

Fig. 13

| No. | Input | | | Output | | | | | | |
|---|---|---|---|---|---|---|---|---|---|---|
| | $D_6$ | $D_5$ | $D_4$ | $RD_7$ | $RD_6$ | $RD_5$ | $RD_4$ | $RD_3$ | $RD_2$ | $RD_1$ |
| 0 | 0 | 0 | 0 | 0 | 0 | 0 | 0 | 0 | 0 | 0 |
| 1 | 0 | 0 | 1 | 0 | 0 | 0 | 0 | 0 | 0 | 1 |
| 2 | 0 | 1 | 0 | 0 | 0 | 0 | 0 | 0 | 1 | 1 |
| 3 | 0 | 1 | 1 | 0 | 0 | 0 | 0 | 1 | 1 | 1 |
| 4 | 1 | 0 | 0 | 0 | 0 | 0 | 1 | 1 | 1 | 1 |
| 5 | 1 | 0 | 1 | 0 | 0 | 1 | 1 | 1 | 1 | 1 |
| 6 | 1 | 1 | 0 | 0 | 1 | 1 | 1 | 1 | 1 | 1 |
| 7 | 1 | 1 | 1 | 1 | 1 | 1 | 1 | 1 | 1 | 1 |
Fig. 14
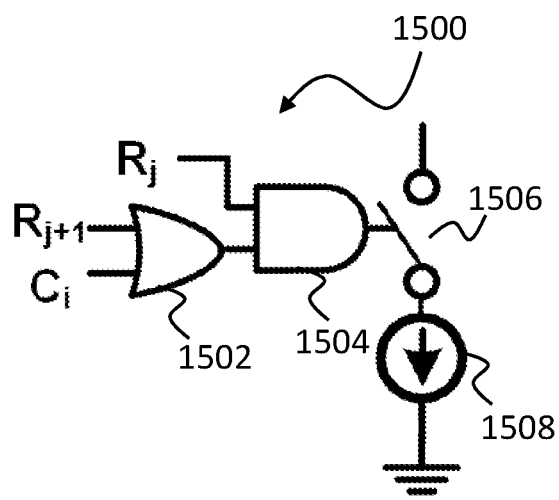
Fig. 15
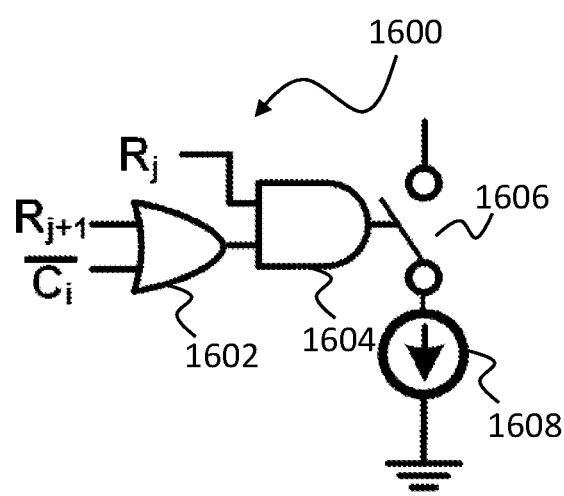
Fig. 16

DIGITAL-TO-ANALOG CONVERSION ARCHITECTURE AND METHOD

TECHNICAL FIELD

The present disclosure relates to digital-to-analog converters (DACs) and, in particular, matrix DACs.

BACKGROUND

Digitally controlled oscillators (DCOs) typically incorporate a voltage-controlled oscillator driven by a control signal from a digital-to-analog converter (DAC). DCOs have various applications in audio integrated circuits (ICs), including digital phase locked loops (DPLLs). DPLLs used in audio applications require a DCO having fine frequency resolution and a DAC with low differential nonlinearity (DNL) to reduce frequency mismatch. Large step changes in DCO output can lead to audible artefacts, which are undesirable.

A thermometer current DAC is a known circuit used in DCOs having low DNL, but which requires an increasingly large amount of control signals as the required number of bits increases. This increase in control signals leads to an undesirable increase in parasitic coupling of control signals. In a matrix DAC architecture, unit cells are arranged in a matrix, and rows and columns of the matrix are controlled by respective row and column decoders. The row and column decoders generate separate thermometer codes which travel within the matrix reaching each cell, thereby reducing the total number of control signals required.

SUMMARY

According to a first aspect of the disclosure, there is provided a digital-to-analog converter (DAC) architecture, comprising: a matrix DAC array comprising a plurality of cells arranged in a first dimension and a second dimension, each cell comprising a local decoder configured to transition the cell between at least two states; and decoding circuitry configured to: receive a digital input signal; and control the plurality of local decoders based on a received digital input signal, wherein each incremental change in the digital input signal results in a transition of a single cell of the plurality of cells such that the plurality of cells transition in sequence, the sequence of transitions of the plurality of cells defining a path through the DAC array; wherein when the path proceeds in the first dimension, the path proceeds to an adjacent cell of the plurality of cells at least 50% of the time; and wherein when the path proceeds in the second dimension, the path proceeds to an adjacent cell of the plurality of cells at least 50% of the time.

In some embodiments, when the path proceeds in the first dimension, the path may proceed to an adjacent cell of the plurality of cells at least 75% of the time. When the path proceeds in the second dimension, the path may proceed to an adjacent cell of the plurality of cells at least 75% of the time.

In some embodiments, when the path proceeds in the first dimension, the path may proceed to an adjacent cell of the plurality of cells. When the path proceeds in the second dimension, the path may proceed to an adjacent cell of the plurality of cells.

In some embodiments, the path may be serpentine or snake like. For example, each successive transition may be to an adjacent cell.

In some embodiments, the path may be spiral. Again, the successive transitions may be to adjacent cells to form the spiral.

Cells of the plurality of cells associated with ranges of the digital input signal requiring a higher accuracy may be positioned in the DAC array proximate to the centre of the spiral path or proximate to the centre of the array, thus improving the accuracy of calculations at those digital input signal values.

In some embodiments, the decoding circuitry may be configured to output control signals to the plurality of local decoders.

The decoding circuitry may comprise one or more clocked registers configured to output the control signals responsive to a clock signal.

The plurality of local decoders may each comprise a flip-flop or latch synchronised by a clock signal.

In some embodiments, the control signals may be Gray coded. Gray code is also known in the art as reflected binary code (RBC) or reflected binary (RB).

In some embodiments, the decoding circuitry and the local decoders may be asynchronous.

The control signals may comprise a thermometric sequence. For example, the control signals may be thermometer coded or unary coded.

In some embodiments, a thermometric sequence may be provided to odd rows of the matrix DAC array and an inverse thermometric sequence may be provided to even rows of the matrix DAC array.

Additionally or alternatively to the above, the digital input signal may be Gray coded.

The decoding circuitry may comprise: a row decoder configured to receive a most significant bit (MSB) word of the digital input signal and output row control signals of the control signals to the plurality of local decoders in the first dimension responsive to the MSB word; and a column decoder configured to receive a least significant bit (LSB) word of the digital input signal and output column control signals of the control signals to the plurality of local decoders in the second dimension responsive to the LSB word.

Local decoders of the plurality of local decoders positioned in an Nth row of the DAC array may each comprise: a first logic NOR gate configured to receive a (N+1)th row control signal and an Mth column control signal from the decoding circuitry; and a second logic NOR gate configured to receive an output of the first logic NOR gate and an Nth row control signal, wherein the (N+1)th row control signal and the Nth row control signal are adjacent row control signals.

Local decoders of the plurality of local decoders positioned in an (N+1)th row of the DAC array may each comprise: a logic NAND gate configured to receive the (N+2)th row control signal and an (M+1)th column control signal from the decoding circuitry; and a logic AND gate configured to receive an output of the logic NAND gate and the (N+1)th row control signal.

The Nth row may be an odd row or an even row of the DAC array.

Local decoders of the plurality of local decoders may each comprise: a logic OR gate configured to receive a next row control signal from the decoding circuitry, the next row control signal provided to local decoders in a next row; and a logic AND gate configured to receive an output of the logic OR gate and a preceding row control signal, the preceding row control signal provided to local decoders in a preceding row. In this context, the next row immediately precedes the preceding row. In other words, the next row is below the preceding row in the array. Local decoders in odd rows of the DAC array may be configured to receive at the logic OR gate a column control signal. Local decoders in even rows of the DAC array may be configured to receive at the logic OR gate a complement of the column control signal.

Local decoders of the plurality of local decoders may each comprise: a logic OR gate configured to receive a first row control signal from the decoding circuitry, the first row control signal provided to all local decoders in a same row as the respective local decoder; and a logic AND gate configured to receive an output of the logic OR gate and a second row control signal. In this example, the second row control signal may be provided to all local decoders in a row preceding the same row referred to above. Local decoders in odd rows of the DAC array may be configured to receive at the logic OR gate a column control signal. Local decoders in even rows of the DAC array may be configured to receive at the logic OR gate a complement of the column control signal.

In some embodiments, the decoding circuitry may comprise: a first decoder configured to generate first thermometer code, each bit of the first thermometer code provided to a different subset of the cells aligned in the first dimension of the DAC array; a second decoder configured to generate a second thermometer code, each bit of the second thermometer code provided to a different subset of the plurality of cells aligned in the second dimension of the DAC array. Each local decoder may be configured to receive one bit of the column thermometer code and one bit of the row thermometer code.

According to another aspect of the disclosure, there is provided a digital-to-analog converter (DAC) architecture, comprising: a matrix DAC array comprising a plurality of cells arranged in rows and columns, each cell comprising a local decoder configured to transition the cell between at least two states; and decoding circuitry configured to: receive a digital input signal; and control the plurality of local decoders based on a received digital input signal, wherein each incremental change in the digital input signal results in a transition of a single cell of the plurality of cells such that the plurality of cells transition in sequence, wherein when transition of a next cell of the plurality of cells in the sequence is to a cell in a different row to an immediately previous cell in the sequence, the next cell is adjacent the immediately previous cell at least 50% of the time; and wherein when transition of the next cell of the plurality of cells in the sequence is to a cell in a different column as an immediately previous cell in the sequence, the next cell is adjacent the immediately previous cell at least 50% of the time.

According to another aspect of the disclosure, there is provided a digital-to-analog converter (DAC) architecture, comprising: a matrix DAC array comprising a plurality of cells, each cell comprising a local decoder configured to transition the cell between at least two states; and decoding circuitry configured to: receive a digital input signal; and control the plurality of local decoders based on a received digital input signal, wherein each incremental transition in the digital input signal results in a transition of a single cell of the plurality of cells adjacent an immediately previously transitioned cell.

According to another aspect of the disclosure, there is provided a digital-to-analog converter (DAC) architecture, comprising: a matrix DAC array comprising a plurality of cells arranged in a first dimension and a second dimension, each cell comprising a local decoder configured to transition the respective cell between at least two states; decoding circuitry configured to: receive a digital input signal to be converted; and output control signals to the plurality of local decoders based on a received digital input signal such that an incremental transition in the digital input signal results in a transition of a single cell of the plurality of cells, wherein the incremental transition in the digital input signal causes a single one of the control signals to transition state.

According to another aspect of the disclosure, there is provided an electronic device comprising one or more of the DAC architectures described above.

The electronic device may comprise one of a mobile computing device, a laptop computer, a tablet computer, a games console, a remote-control device, a home automation controller or a domestic appliance, a toy, a robot, an audio player, a video player, or a mobile telephone, and a smartphone.

According to another aspect of the disclosure, there is provided a method in a digital-to-analog (DAC) architecture, comprising a matrix DAC array comprising a plurality of cells arranged in a first dimension and a second dimension, each cell comprising a local decoder configured to transition the cell between at least two states, the method comprising: receiving a digital input signal; and controlling the plurality of local decoders based on a received digital input signal, such that each incremental change in the digital input signal results in a transition of a single cell of the plurality of cells such that the plurality of cells transition in sequence, the sequence of transitions of the plurality of cells defining a path through the DAC array; wherein when the path proceeds in the first dimension, the path proceeds to an adjacent cell of the plurality of cells at least 50% of the time; and wherein when the path proceeds in the second dimension, the path proceeds to an adjacent cell of the plurality of cells at least 50% of the time.

According to another aspect of the disclosure, there is provided a method in a digital-to-analog (DAC) architecture, comprising a matrix DAC array comprising a plurality of cells arranged in rows and columns, each cell comprising a local decoder configured to transition the cell between at least two states, the method comprising: receiving a digital input signal; and controlling the plurality of local decoders based on a received digital input signal, such that each incremental change in the digital input signal results in a transition of a single cell of the plurality of cells such that the plurality of cells transition in sequence, wherein when transition of a next cell of the plurality of cells in the sequence is to a cell in a different row to an immediately previous cell in the sequence, the next cell is adjacent the immediately previous cell at least 50% of the time; and wherein when transition of the next cell of the plurality of cells in the sequence is to a cell in a different column as an immediately previous cell in the sequence, the next cell is adjacent the immediately previous cell at least 50% of the time.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which:

FIG. 8 is a truth table of showing the relationship between input code and output control signals for a column decoder of the matrix DAC of FIG. 5 according to some embodiments;

FIG. 9 is a truth table of showing the relationship between input code and output control signals for a row decoder of the matrix DAC of FIG. 5 according to some embodiments;

FIG. 12 is a truth table of showing the relationship between Gray coded input code and output control signals for a column decoder of the matrix DAC of FIG. 5 according to some embodiments;

FIG. 13 is a truth table of showing the relationship between Gray coded input code and output control signals for a row decoder of the matrix DAC of FIG. 5 according to some embodiments;

FIG. 14 is a truth table of showing the relationship between input code and output control signals for a row decoder of the matrix DAC of FIG. 5 according to some embodiments;

FIGS. 15 and 16 are schematic diagrams of respective column and row local decoders of the matrix DAC of FIG. 5 according to some embodiments;

DESCRIPTION OF EMBODIMENTS

The term "path" as used herein refers to the route taken by a sequence of transitions of successively switched cells of a matrix DAC in response to incremental changes in input code. For example, if a digital input code input into a matrix DAC incrementally increases from 0 to 14, a "path" is defined by fourteen (14) successive transitions of cells within the matrix DAC which each transition in response to one of the 14 incremental changes in the digital input code.

The term "serpentine" is used herein to refer to the manner in which successive transitions of switched cells of a matrix DAC define a winding path or line within a cell array of the matrix DAC.

Figure 1:
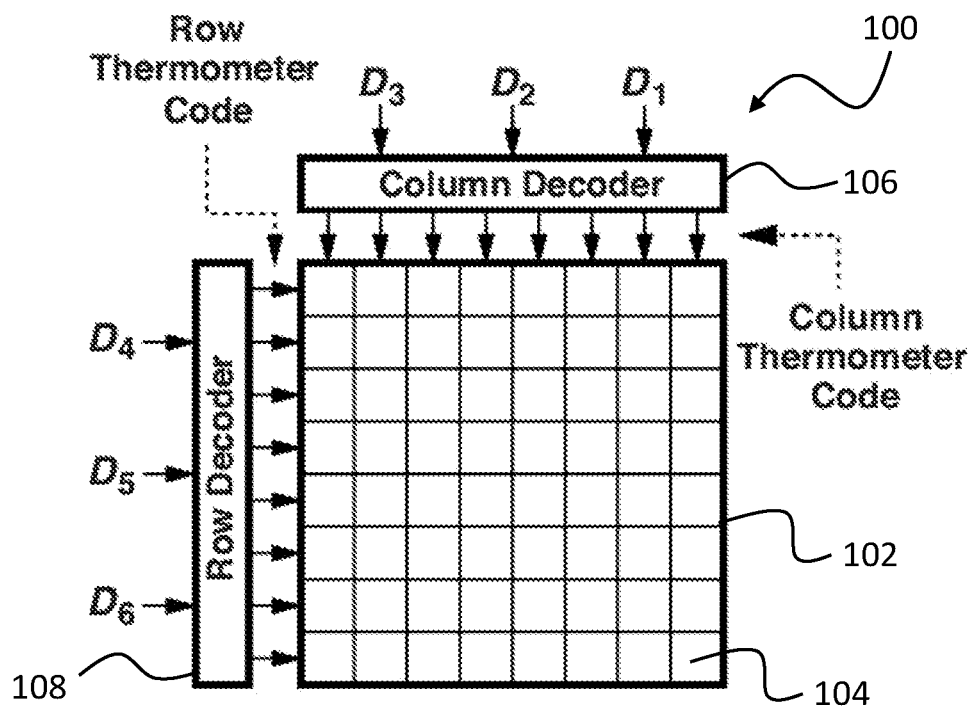
FIG. 1 is a schematic diagram of a known matrix DAC.

FIG. 1 is a schematic diagram of a known matrix DAC 100 comprising a two-dimensional array 102 of unit cells 104 arranged in a first dimension (e.g. rows) and a second dimension (e.g. columns). An input binary code is decomposed into a least significant bit (LSB) word (D3-D1) and a most significant bit (MSB) word (D6-D4), which are applied to a column decoder 106 and a row decoder 108, respectively. The column and row decoders 106, 108 each generate separate thermometer codes which are applied to local decoders in each cell 104 such that each incremental changes in the input binary code cause a single one of the unit cells 104 to transition state.

Figure 2:
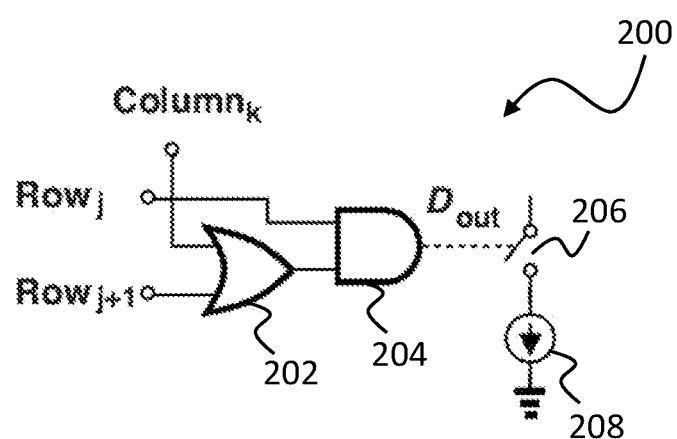
FIG. 2 is a schematic diagram of a local decoder of the matrix DAC of FIG. 1.

FIG. 2 is a schematic diagram of a local decoder 200 which may be implemented in each of the unit cells 104 in the array 102. The local decoder 200 comprises an OR gate 202, an AND gate 204, and a switch 206 controlling a current source 208. An output of the AND gate 204 is configured to control the switch 206 so as to transition the cell 104 (i.e. to switch the current source 208 on or off). The OR gate 202 receives inputs from the control signal (Column k) of the column in which the unit cell 104 is located and the control signal (Row j+1) of the row next to the row in which the unit cell 104 is located. The AND gate 204 receives inputs from the output of the OR gate 202 and the control signal (Row j) of the row in which the unit cell 104 is located. The current source 208 is switched on if Row j=1 and if Row j+1=1 or Column k=1. That is, if both Row values are equal to 1, Dout=1, and if Row j=1 and Row j+1=0, then Column k determines the output.

Figures 3, 4:
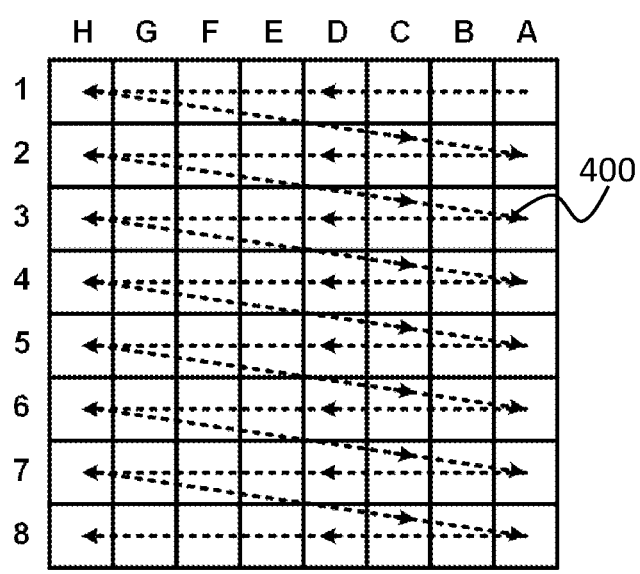
FIG. 3 is a diagram showing an example state of the matrix DAC of FIG. 1.
FIG. 4 is a diagram showing a path of sequential transitions of cells of the matrix DAC of FIG. 1.

FIG. 3 depicts one example state of the array 102 for one combination of row and column thermometer codes. It can be seen that a "1" in a row switches that entire row of cells 104 on whereas a "1" in a column switches one cell 104 in a partially on row. In the example, the first three rows of cells 104 are all on, three of the fourth row of cells 104 are on, and all of the last four rows are off.

The matrix DAC 100 shown in FIG. 1 is relatively compact in design. However, the control lines travelling across the array of cells 104 can experience unequal delays, causing glitches at the output of the DAC 100. This is best illustrated with reference to FIG. 4 which shows a path 400 defined by a sequence of transitions of the cells 104 in response to incremental changes in the binary digital input. When the binary input code changes from the last cell in a row (previous cell) to the first cell in the next row (next cell) (i.e. from H1 to A2), the DNL error is large due to the distance between the next cell (A2) and the previous cell (H1). This systematic DNL error increases as the number of bits of the matrix DAC 100 increases, due to the increased physical distance between cells. This increased DNL error presents a barrier to the implementation of state of the art matrix DAC architecture for high resolution applications.

Embodiments of the present disclosure aim to address or at least ameliorate one or more of the above problems by reducing the physical distance between sequentially switched cells in a matrix DAC. Embodiments of the present disclosure implement novel decoding techniques to minimize or at least reduce instances in which a subsequent cell to be switched in a matrix DAC array is not physically adjacent or at least near to a previously switched cell. Whilst some embodiments of the disclosure aim to ensure immediately successive transitions are to adjacent cells, other embodiments aim to reduce the distance between successively transitioned cells. In both cases, when the matrix DAC is used for converting audio data, audible pops associated with larger step sizes may be eliminated or at least reduced.

Embodiments of the present disclosure also aim to reduce error associated with switching in row and column decoders by implementing Gray coding (or reflected binary coding (RBC)) in the matrix DAC decoders. Such Gray coding is preferably implemented both for input codes (received at the matrix DAC) and output codes (provided to cells in the matrix DAC array). Doing so ensures only a single one of the output bits of the encoding circuitry switches during any one incremental change in digital input code. This reduces switching activity and minimizes coupled noise. This also allows the outputs of the decoding circuitry to be implemented in asynchronous logic, thereby minimizing computational power and circuit real estate.

Embodiments of the present disclosure also enable scaling of matrix DAC architecture to increase resolution whilst maintaining high DNL, and without creating impractical layout requirements.

When implemented in digital PLLs, embodiments of the present disclosure aim to reduce the possibility of PLL unlock due to phase mismatch and/or DNL error.

Figure 5:
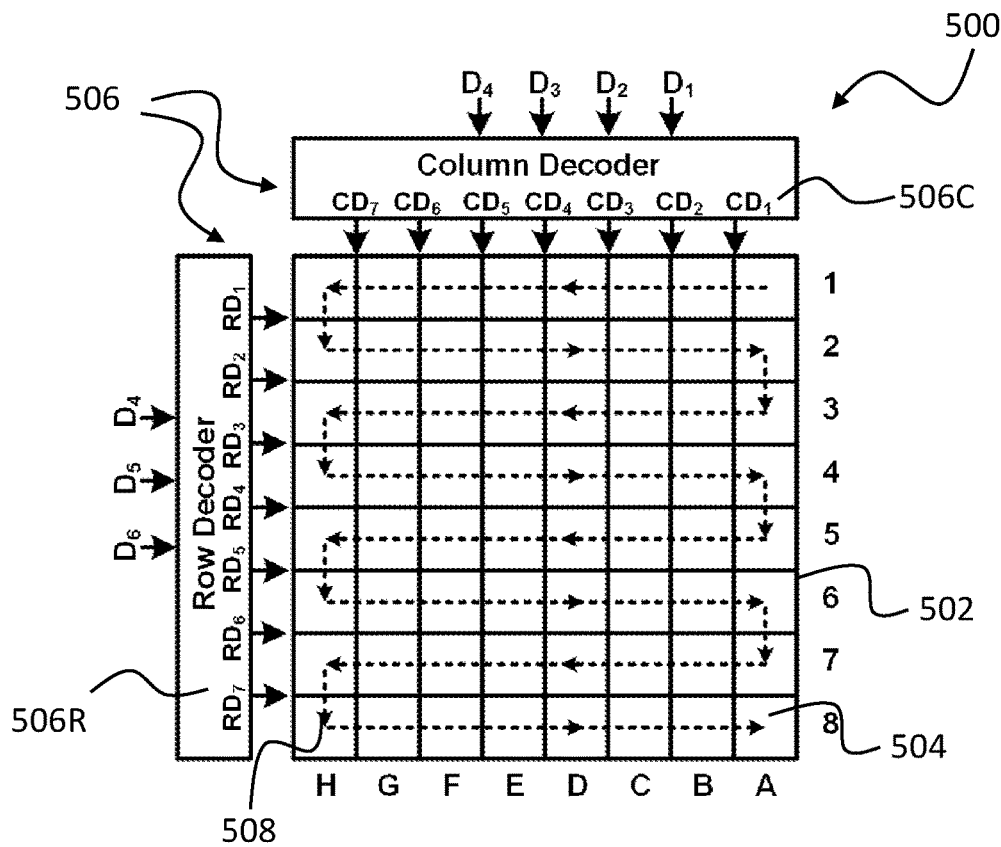
FIG. 5 is a schematic diagram of a matrix DAC according to embodiments of the present disclosure.

FIG. 5 is a schematic diagram of a matrix DAC 500 according to embodiments of the present disclosure. The matrix DAC 500 comprises a two-dimensional array 502 of cells 504 arranged in a first dimension (e.g. rows) and a second dimension (e.g. columns). In embodiments described herein, the first dimension is described as running across the page from left to right (i.e. along a row) and the second dimension is described as running down the page from top to bottom (i.e. along a column). It will be appreciated, however, that the first and second dimensions could be switched round without departing from the spirit and scope of the present disclosure.

The matrix DAC 500 further comprises decoding circuitry 506 comprising a row decoder 506R and a column decoder 506C. It will be appreciated that, whilst the examples depicted herein comprises separate row and column decoders, in other embodiments the decoding circuitry may be provided as a single module or unit or as more than two modules or units.

In the embodiment shown, input binary code is decomposed into a LSB word (D3 to D1) and a MSB word (D6 to D4), which are applied to the column decoder 506C and the row decoder 506R, respectively.

Like the column and row decoders 106, 108 of the DAC 100 in FIG. 1, the column and row decoders 506C, 506R each generate separate thermometer codes. However, in contrast to the DAC 100, the decoding circuitry controls the cells 104 such that every even row has a reversed thermometric column decoding. In doing so, a different path 508 shown in FIG. 5 is defined by a sequence of transitions of the cells 104 in response to incremental changes in the binary digital input. It can be seen that when a transition of the next cell in a sequence of cells being transitioned is in a new row of the array 502, that next cell being transitioned is adjacent the previously transitioned cell. Taking the transition of cells H1 and H2 as an example, the switching of cell H2 (in the second row) proceeds immediately after the switching of cell H1. Likewise, the switching of cell A3 (in the third row) proceeds immediately after the switching of cell A2 as the binary digital input increases. Thus, the path 508 defined by the sequence of transitions follows a snake or serpentine pattern within the array 502. Since incremental changes in the binary input always result in an adjacent cell being switched, DNL error may be minimized.

Figure 6:
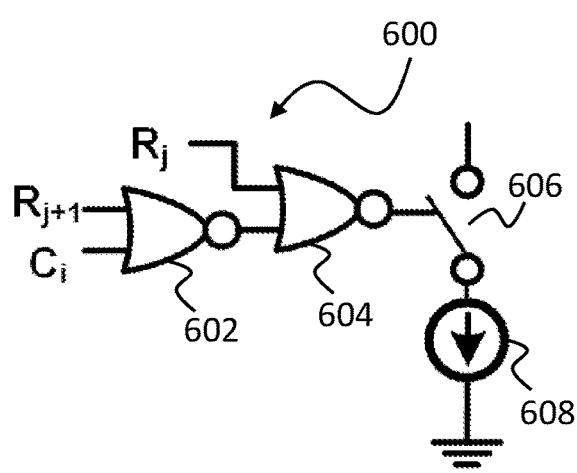
FIGS. 6 and 7 are schematic diagrams of respective column and row local decoders of the matrix DAC of FIG. 5 according to some embodiments.
Figure 7:
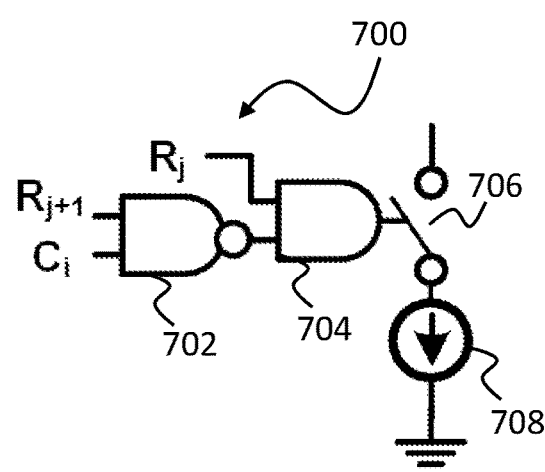

Odd and even local decoders 600, 700 used to implement the proposed matrix DAC 500 are shown in FIGS. 6 and 7 respectively. The odd local decoder 600 shown in FIG. 6 is provided in each of the cells located in odd rows (i.e. rows 1, 3, 5 and 7). The even local decoder 700 shown in FIG. 7 is provided in each of the cells located in odd rows (i.e. rows 2, 4, 6 and 8).

The odd local decoder 600 comprises a first NOR gate 602, a second NOR gate 604, and a switch 606 controlling a current source 608. An output of the second NOR gate 604 is configured to control the switch 606 so as to transition the cell 504 (i.e. to switch the current source 608 on or off). The first NOR gate 602 receives inputs from the control signal (Column i) of the column in which the unit cell 504 is located and the control signal (Row j+1) of the row next to (after) the row in which the unit cell 504 is located. The second NOR gate 604 receives inputs from the output of the first NOR gate 602 and the control signal (Row j) of the row in which the unit cell 504 is located. The current source 608 is switched on if Row j=0 and Row j+1=1 and Column i=0, or if Row j=0 and Row j+1=0 and Column i=1, or if Row j=0 and Row j+1=1 and Column i=1. That is, if both row values are equal to 0, column i determines the output.

The even local decoder 700 comprises a NAND gate 702, an AND gate 704, and a switch 706 controlling a current source 708. An output of the AND gate 704 is configured to control the switch 706 so as to transition the cell 504 (i.e. to switch the current source 708 on or off). The NAND gate 702 receives inputs from the control signal (Column i) of the column in which the unit cell 504 is located and the control signal (Row j+1) of the row next to (after) the row in which the unit cell 504 is located. The AND gate 704 receives inputs from the output of the NAND gate 702 and the control signal (Row j) of the row in which the unit cell 504 is located. The current source 708 is switched on if Row j=1 and Row j+1=0 and Column i=0, or if Row j=1 and Row j+1=0 and Column i=1, or if Row j=0 and Row j+1=1 and Column i=0. That is, if both Row values are equal to 1, column i determines the output.

FIG. 8 is a truth table for the column decoder 506C shown in FIG. 5. It can be seen that the column decoder 506C generates an incremental thermometric code 802 at its output when the input bit D4 is '0' (zero), '0' of D4 representing an odd row. The column decoder 506C then generates a reverse thermometric code 804 at its output when the input bit D4 is '1' (one), '1' of D4 representing an odd row. It can also be seen that the output code generated by the column decoder 506C is such that switching to any adjacent output code results in a transition of a single one of the output bits CD1 to CD7.

FIG. 9 is a truth table for the row decoder 506R shown in FIG. 5. It can be seen that the tow decoder 506R generates a thermometric code output (from RD7 to RD1), the code of even rows (RD6, RD4, RD2) being inverted relative to the code of odd rows (RD7, RD5, RD3, RD1).

It will be appreciated that timing errors in the input binary code D1-D6 and within the decoding circuitry 500 may result in undesirable transition glitches in the output code CD1-CD7, RD1-RD7. Accordingly, in some embodiments the decoding circuitry 500 may include one or more clock-based registers configured to synchronize transitions in the output code CD1-CD7, RD1-RD7.

Figure 10:
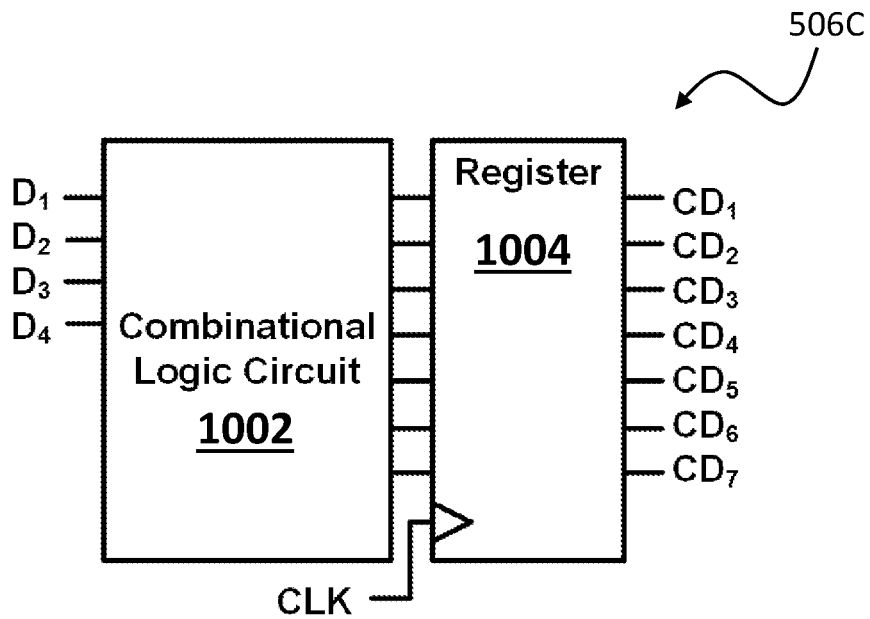
FIG. 10 is a block diagram of an example column decoder of the matrix DAC of FIG. 5.
Figure 11:
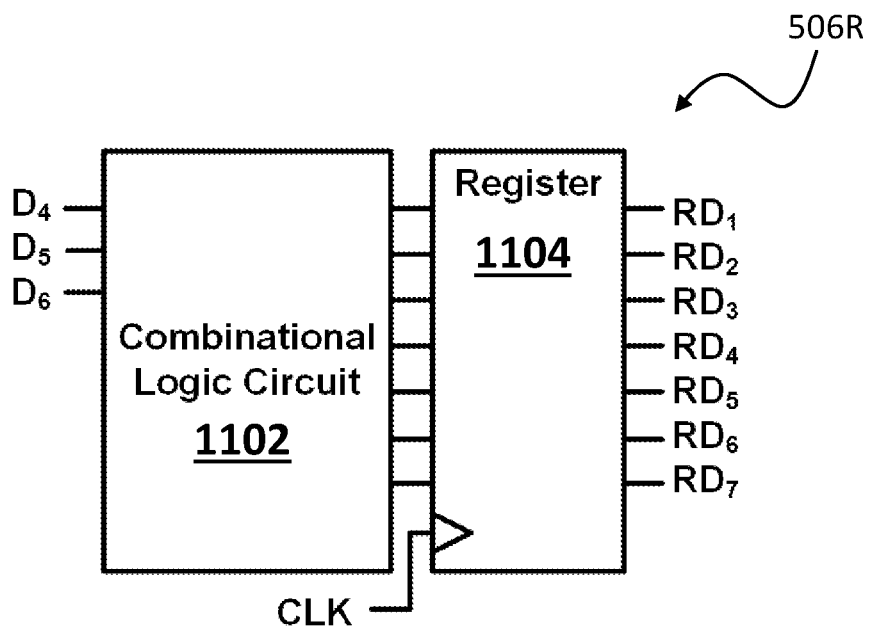
FIG. 11 is a block diagram of an example row decoder of the matrix DAC of FIG. 5.

FIGS. 10 and 11 are block diagrams of example embodiments of the column and row decoders 506C, 506R, respectively.

Referring first to FIG. 10, the column decoder 506C comprises combinational logic 1002 configured to generate the thermometric code shown in FIG. 8. The generated code is then provided to a register 1004 which outputs the new output code in synchrony with an input clock signal CLK (i.e. updating the outputs of the register on a rising or falling edge of the clock CLK).

Referring to FIG. 11, the row decoder 506R similarly comprises combinational logic 1102 configured to generate the thermometric code shown in FIG. 9. The generated output code is provided to a register 1104 which outputs the new output code in synchrony with the input clock signal CLK (i.e. updating the outputs of the register on a rising or falling edge of the clock CLK).

Instead of providing the registers 1004, 1104 at the output of the combination logic 1002, 1102, a flip flop or latch (not shown) may be provided in each local decoder 600, 700 between the final logic gate of each decoder and the switch 606, 608. It will be appreciated, however, that having a flip flop or latch in each of the local decoders 600, 700 will be higher power and take up more space than providing registers 1004, 1104 in the column and row decoders 506C, 506R.

In the embodiment described above, the input binary code D1-D4 is provided as conventional binary. In some embodiments, to reduce transition glitch the input binary code may be provided as Gray code, obfuscating the need for registers in the column and row decoders 506C, 506R or flip flops in the local decoders 600, 700.

FIG. 12 is a truth table showing the input and output codes for a variation of the column decoder 506C which received Gray input code (GC4-GC1). It can be seen that only a single bit of the input code (GC4-GC1) transitions between incremental changes in the representative value and only a single bit of the output code CD7-CD1 transitions between incremental changes in the representative value. The result is glitch free code output from the column decoder 506C.

FIG. 13 is a truth table showing the input and output codes for a variation of the row decoder 506R which receives Gray input code (GR3-GR1). It can be seen that only a single bit of the input code (GR3-GR1) transitions between incremental changes in the representative value and only a single bit of the output code RD7-RD1 transitions between incremental changes in the representative value. The result is glitch free code output from the row decoder 506C.

By implementing column and row decoders which receive and output Gray code, glitches can be minimized or substantially eliminated. In such embodiments, there is no necessity for registers in the column and row decoders 506C, 506C or flip flops in the individual cells 504 of the matrix DAC 500.

In the embodiments described above with reference to FIGS. 5 to 13, the column and row decoders 506C, 506R are configured to implement a bespoke thermometric output which differs from that of the conventional column and row decoders 106, 108 shown in FIG. 1.

FIGS. 14 to 16 illustrate an alternative solution to that described above with reference to FIG. 5. In this embodiment, the column decoder 506C of the matrix DAC 500 shown in FIG. 5 is used. In contrast, however, the row decoder 506R is replaced with a row decoder (not shown) that generates thermometric output code as shown in FIG. 14.

FIGS. 15 and 16 show respective odd and even local decoders 1500, 1600 configured to operate in combination with the column output code shown in FIG. 8 or FIG. 12 and the row output code shown in FIG. 14.

The odd local decoder 1500 shown in FIG. 15 is provided in each of the cells located in odd rows (i.e. rows 1, 3, 5 and 7). The even local decoder 1600 shown in FIG. 16 is provided in each of the cells located in odd rows (i.e. rows 2, 4, 6 and 8).

The odd local decoder 1500 comprises an OR gate 1502, an AND gate 1504, and a switch 1506 controlling a current source 1508. An output of the AND gate 1504 is configured to control the switch 1506 so as to transition the cell 504 (i.e. to switch the current source 1508 on or off). The OR gate 1502 receives inputs from the control signal (Column i) of the column in which the unit cell 504 is located and the control signal (Row j+1) of the row next to (after) the row in which the unit cell 504 is located. The AND gate 1504 receives inputs from the output of the OR gate 1502 and the control signal (Row j) of the row in which the unit cell 504 is located. The current source 1508 is switched on if Row j=1 and Row j+1=1 and Column i=0, or if Row j=1 and Row j+1=0 and Column i=1, or if Row j=1 and Row j+1=1 and Column i=1. That is, if both Row values are equal to 1, Dout=1, and if Row j=1 and Row j+1=0, then Column i determines the output. This odd local decoder 1500 is substantially identical to the local decoder 200 shown in FIG. 2.

The even local decoder 1600 also comprises an OR gate 1602, an AND gate 1604, and a switch 1606 controlling a current source 1608. An output of the AND gate 1604 is configured to control the switch 1606 so as to transition the cell 504 (i.e. to switch the current source 1608 on or off). The OR gate 1602 receives inputs from an inverted version of the control signal (Column i') of the column in which the unit cell 504 is located and the control signal (Row j+1) of the row next to (after) the row in which the unit cell 504 is located. The AND gate 1604 receives inputs from the output of the OR gate 1602 and the control signal (Row j) of the row in which the unit cell 504 is located. The current source 208 is switched on if Row j=1 and Row j+1=1 or Column i'=1 (i.e. Column i=0). That is, if both Row values are equal to 1, Dout=1, and if Row j+1=0, then Column i' again determines the output. However, since the column i control signal is inverted, if Row j+1=0, the even local decoder 1600 will switch the current source 1608 in an opposite fashion to the odd local decoder 1500.

The above architecture can thus also achieve a sequence of transitions which define a path 508 following a serpentine pattern within the array 502.

Figure 17:
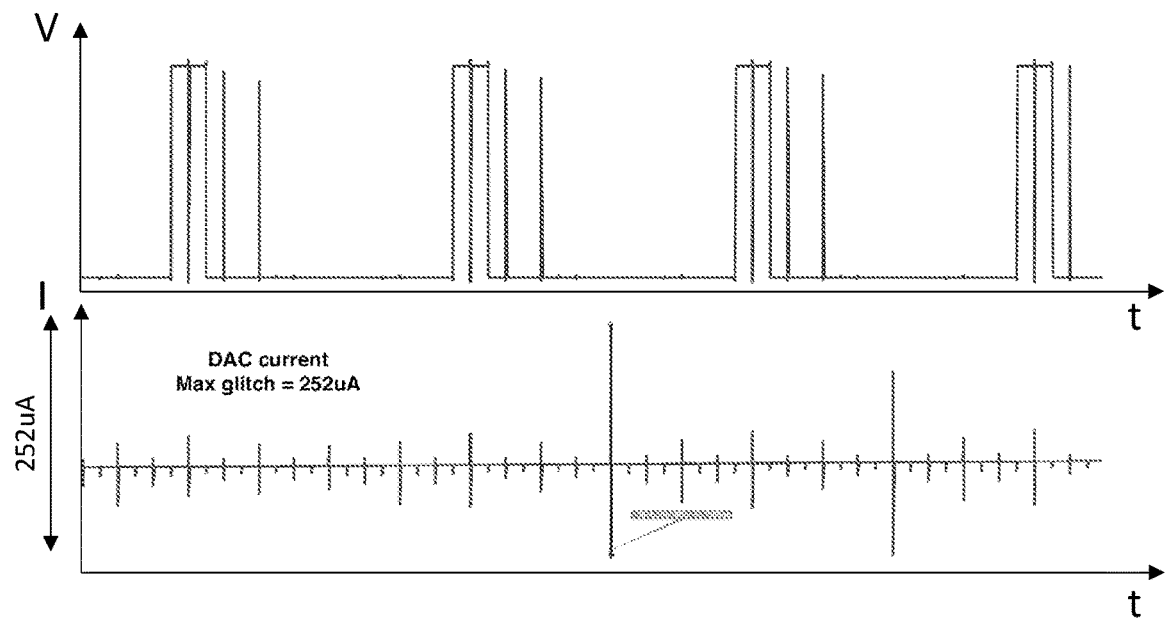
FIG. 17 graphically illustrates an example output of the encoding circuitry of the matrix DAC of FIG. 5 without Gray coding or synchronisation and the corresponding current glitch at the output of the matrix DAC.
Figure 18:
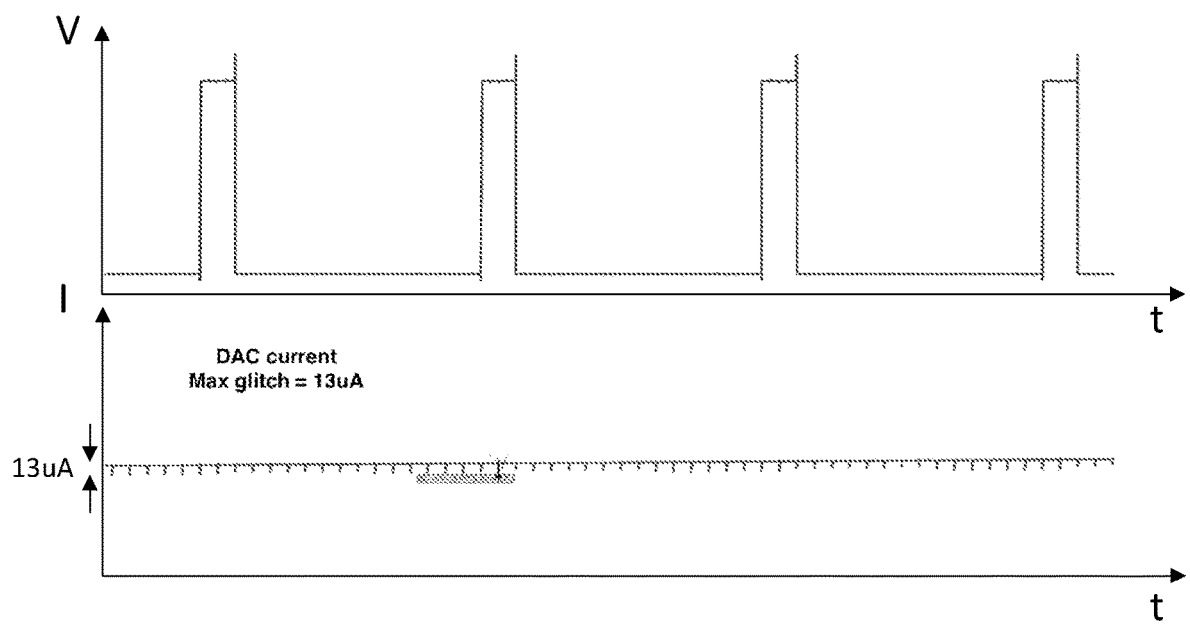
FIG. 18 graphically illustrates an example output of the encoding circuitry of the matrix DAC of FIG. 5 with Gray coding or synchronisation and the corresponding current glitch at the output of the matrix DAC.

FIGS. 17 and 18 are graphs showing a comparison between a glitchy transition (FIG. 17) and a non-glitchy transition (FIG. 18) due to the provision of registers, flip-flops or Gray coding described with reference to FIGS. 10 to 13. It can be seen that a glitchy transition such as that shown in FIG. 17 results in a maximum glitch on the output of the matrix DAC 500 of 252 uA, whereas a non-glitchy transition results in a maximum glitch of 13 uA.

Figure 19:
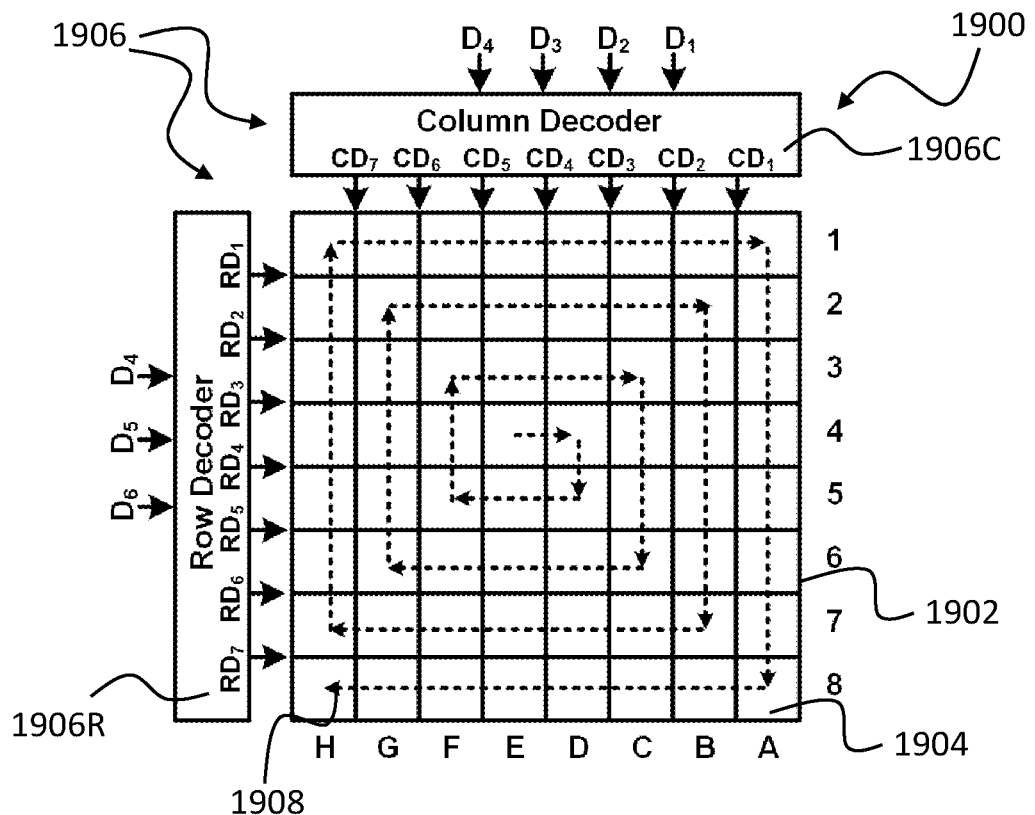
FIG. 19 is a schematic diagram of a matrix DAC according to embodiments of the present disclosure.
Figure 20:
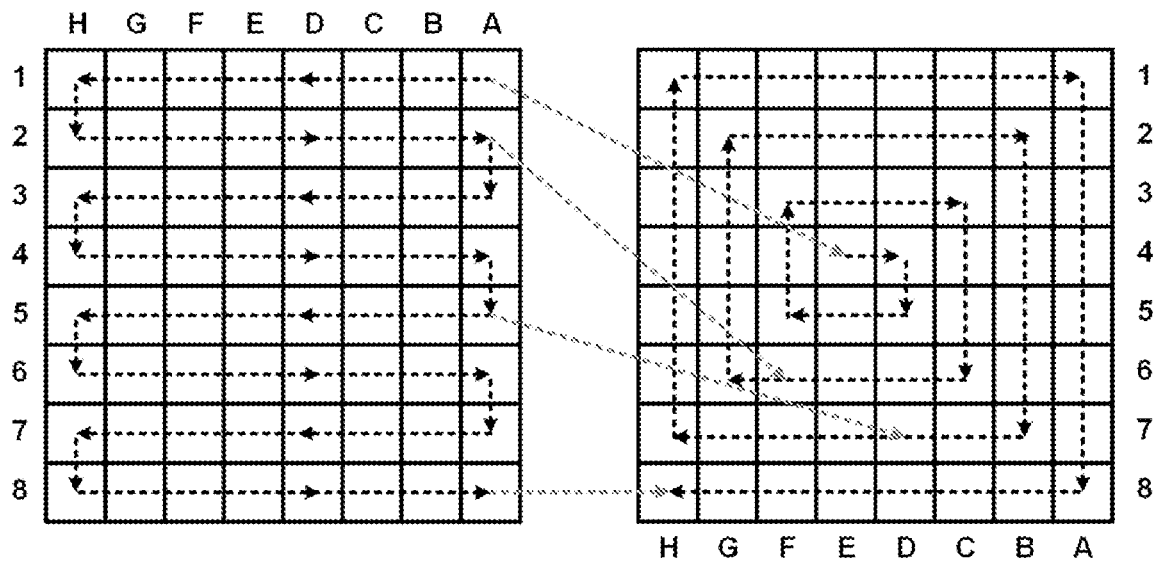
FIG. 20 is a diagram showing the cell translation between the routing of the matrix DAC shown in FIG. 5 and the matrix DAC shown in FIG. 20.

FIGS. 19 and 20 illustrate a variation of the matrix DAC 500 shown in FIG. 5. In contrast to the matrix DAC 500, the matrix DAC 1900 is configured such that a path 1908 defined by immediately successive transitions of cells 1904 in the array 1902 follow a spiral pattern within the array 1902. A useful comparison is shown in FIG. 20 which illustrates the translation of respective cells in the matrix DAC 500 of FIG. 5 to the matrix DAC 1900 shown in FIG. 19. It can be seen that when a transition of the next cell in a sequence of cells being transitioned is in a new row of the array 1902, that next cell being transitioned is adjacent the previously transitioned cell.

The mismatch error between cells in the centre area of the array 1902 is smaller than at the edge of the array 1902. Accordingly, in some embodiments, more important code ranges requiring smaller error may be positioned close to the centre of the matrix DAC 1900 so as to improve the accuracy of conversion for those more important code ranges.

Figure 21:
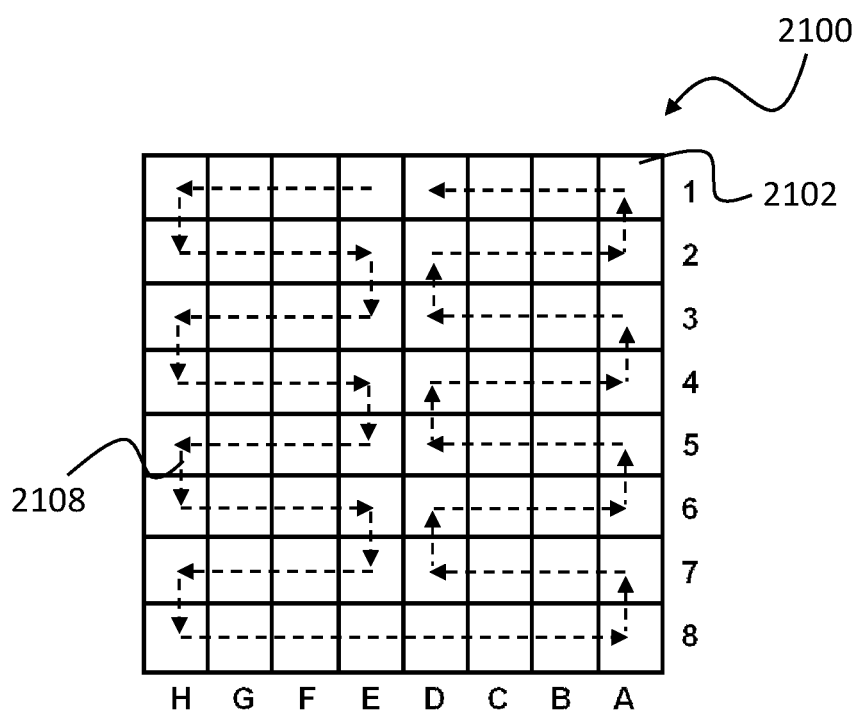
FIG. 21 is schematic diagram of a cell array of a matrix DAC which is a further variation of the matrix DACs of FIGS. 5 and 19.

FIG. 21 provides yet another variation of the matrix DAC 500 shown in FIG. 5. In contrast to the matrix DAC 500, a path 2108 defined the matrix DAC 2100 by immediately successive transitions of cells 1904 in the array 1902 follow an again different pattern. Whilst the pattern may be different, when a transition of the next cell in a sequence of cells being transitioned is in a new row of the array 2102, that next cell being transitioned is adjacent the previously transitioned cell.

In embodiments described above, transitions to the next cell in the sequence of transitions are to physically adjacent cells in the arrays. It will be appreciated, however, that embodiments are not so limited. For example, an advantage over the conventional matrix DAC 100 shown in FIG. 1 may still be achieved by even a small reduction in the physical distance between successively transitioning cells. For example, some embodiments of the disclosure may ensure only that when transition of a next cell of a plurality of cells in a sequence is to a cell in a different row to an immediately previous cell in the sequence, the next cell is adjacent the immediately previous cell at least 50% of the time, and that a transition of the next cell of a plurality of cells in the sequence is to a cell in a different column as an immediately previous cell in the sequence, the next cell is adjacent the immediately previous cell at least 50% of the time. For example, some embodiments of the disclosure may ensure only that when transition of a next cell of a plurality of cells in a sequence is to a cell in a different row to an immediately previous cell in the sequence, the next cell is adjacent the immediately previous cell at least 75% of the time, and that a transition of the next cell of a plurality of cells in the sequence is to a cell in a different column as an immediately previous cell in the sequence, the next cell is adjacent the immediately previous cell at least 75% of the time. For example, some embodiments of the disclosure may ensure only that when transition of a next cell of a plurality of cells in a sequence is to a cell in a different row to an immediately previous cell in the sequence, the next cell is adjacent the immediately previous cell all of the time, and that a transition of the next cell of a plurality of cells in the sequence is to a cell in a different column as an immediately previous cell in the sequence, the next cell is adjacent the immediately previous cell all of the time. In all of these examples, the number of transitions which are to non-physically adjacent cells is reduced, thereby reducing the DNL error associated with such transitions.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general-purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Digital-to-analog converter (DAC) architecture, comprising:
   a matrix DAC array comprising a plurality of cells arranged in a first dimension and a second dimension, each cell comprising a local decoder configured to transition the cell between at least two states; and
   decoding circuitry configured to:
      receive a digital input signal; and
      control the plurality of local decoders based on a received digital input signal, wherein each incremental change in the digital input signal results in a transition of a single cell of the plurality of cells such that the plurality of cells transition in sequence, the sequence of transitions of the plurality of cells defining a path through the DAC array;
   wherein when the path proceeds in the first dimension, the path proceeds to an adjacent cell of the plurality of cells at least 50% of the time; and
   wherein when the path proceeds in the second dimension, the path proceeds to an adjacent cell of the plurality of cells at least 50% of the time.

2. The DAC architecture of claim 1,
   wherein when the path proceeds in the first dimension, the path proceeds to an adjacent cell of the plurality of cells at least 75% of the time; and
   wherein when the path proceeds in the second dimension, the path proceeds to an adjacent cell of the plurality of cells at least 75% of the time.

3. The DAC architecture of claim 1,
   wherein when the path proceeds in the first dimension, the path proceeds to an adjacent cell of the plurality of cells; and
   wherein when the path proceeds in the second dimension, the path proceeds to an adjacent cell of the plurality of cells.

4. The DAC architecture of claim 1, wherein the path is serpentine.

5. The DAC architecture of claim 1, wherein the path is spiral.

6. The DAC architecture of claim 5, wherein cells of the plurality of cells associated with ranges of the digital input signal requiring a higher accuracy are positioned in the DAC array proximate to the centre of the spiral path.

7. The DAC architecture of claim 1, wherein the decoding circuitry is configured to output control signals to the plurality of local decoders.

8. The DAC architecture of claim 7, wherein the decoding circuitry comprises one or more clocked registers configured to output the control signals responsive to a clock signal.

9. The DAC architecture of claim 7, wherein the plurality of local decoders each comprise a flip-flop or latch synchronised by a clock signal.

10. The DAC architecture of claim 7, wherein the control signals are Gray coded.

11. The DAC architecture of claim 10, where the decoding circuitry and the local decoders are asynchronous.

12. The DAC architecture of claim 7, wherein the control signals comprise a thermometric sequence.

13. The DAC architecture of claim 12, wherein the thermometric sequence is provided to odd rows of the matrix DAC array and an inverse thermometric sequence is provided to even rows of the matrix DAC array.

14. The DAC architecture of claim 1, wherein the digital input signal is Gray coded.

15. The DAC architecture of claim 7, wherein the decoding circuitry comprises:
   a row decoder configured to receive a most significant bit (MSB) word of the digital input signal and output row control signals of the control signals to the plurality of local decoders in the first dimension responsive to the MSB word; and
   a column decoder configured to receive a least significant bit (LSB) word of the digital input signal and output column control signals of the control signals to the plurality of local decoders in the second dimension responsive to the LSB word.

16. The DAC architecture of claim 1, wherein local decoders of the plurality of local decoders positioned in an Nth row of the DAC array each comprise:
   a first logic NOR gate configured to receive a (N+1)th row control signal and an Mth column control signal from the decoding circuitry; and
   a second logic NOR gate configured to receive an output of the first logic NOR gate and an Nth row control signal, wherein the (N+1)th row control signal and the Nth row control signal are adjacent row control signals.

17. The DAC architecture of claim 15, wherein local decoders of the plurality of local decoders positioned in an (N+1)th row of the DAC array each comprise:
   a logic NAND gate configured to receive the (N+2)th row control signal and an (M+1)th column control signal from the decoding circuitry; and
   a logic AND gate configured to receive an output of the logic NAND gate and the (N+1)th row control signal.

18. The DAC architecture of claim 16, wherein the Nth row is an odd row or an even row of the DAC array.

19. The DAC architecture of claim 1, wherein local decoders of the plurality of local decoders each comprise:
a logic OR gate configured to receive a next row control signal from the decoding circuitry, the next row control signal provided to local decoders in a next row; and
a logic AND gate configured to receive an output of the logic OR gate and a preceding row control signal, the preceding row control signal provided to local decoders in a preceding row, wherein the next row immediately precedes the preceding row,
wherein local decoders in odd rows of the DAC array are configured to receive at the logic OR gate a column control signal,
wherein local decoders in even rows of the DAC array are configured to receive at the logic OR gate a complement of the column control signal.

20. The DAC architecture of claim 1, wherein local decoders of the plurality of local decoders each comprise:
a logic OR gate configured to receive a first row control signal from the decoding circuitry, the first row control signal provided to all local decoders in a same row as the respective local decoder; and
a logic AND gate configured to receive an output of the logic OR gate and a second row control signal, the second row control signal provided to all local decoders in a row preceding the same row,
wherein local decoders in odd rows of the DAC array are configured to receive at the logic OR gate a column control signal,
wherein local decoders in even rows of the DAC array are configured to receive at the logic OR gate a complement of the column control signal.

21. DAC architecture of claim 1, wherein the decoding circuitry comprises:
a first decoder configured to generate first thermometer code, each bit of the first thermometer code provided to a different subset of the cells aligned in the first dimension of the DAC array;
a second decoder configured to generate a second thermometer code, each bit of the second thermometer code provided to a different subset of the plurality of cells aligned in the second dimension of the DAC array,
wherein each local decoder is configured to receive one bit of the column thermometer code and one bit of the row thermometer code.

22. Digital-to-analog converter (DAC) architecture, comprising:
a matrix DAC array comprising a plurality of cells arranged in rows and columns, each cell comprising a local decoder configured to transition the cell between at least two states; and
decoding circuitry configured to:
receive a digital input signal; and
control the plurality of local decoders based on a received digital input signal, wherein each incremental change in the digital input signal results in a transition of a single cell of the plurality of cells such that the plurality of cells transition in sequence,
wherein when transition of a next cell of the plurality of cells in the sequence is to a cell in a different row to an immediately previous cell in the sequence, the next cell is adjacent the immediately previous cell at least 50% of the time; and
wherein when transition of the next cell of the plurality of cells in the sequence is to a cell in a different column as an immediately previous cell in the sequence, the next cell is adjacent the immediately previous cell at least 50% of the time.

23. Digital-to-analog converter (DAC) architecture, comprising:
a matrix DAC array comprising a plurality of cells, each cell comprising a local decoder configured to transition the cell between at least two states; and
decoding circuitry configured to:
receive a digital input signal; and
control the plurality of local decoders based on a received digital input signal, wherein each incremental transition in the digital input signal results in a transition of a single cell of the plurality of cells adjacent an immediately previously transitioned cell.

24. Digital-to-analog converter (DAC) architecture, comprising:
a matrix DAC array comprising a plurality of cells arranged in a first dimension and a second dimension, each cell comprising a local decoder configured to transition the respective cell between at least two states;
decoding circuitry configured to:
receive a digital input signal to be converted; and
output control signals to the plurality of local decoders based on a received digital input signal such that an incremental transition in the digital input signal results in a transition of a single cell of the plurality of cells,
wherein the incremental transition in the digital input signal causes a single one of the control signals to transition state.

25. An electronic device comprising the DAC architecture of claim 1.

26. The electronic device of claim 25, wherein the device comprises one of a mobile computing device, a laptop computer, a tablet computer, a games console, a remote-control device, a home automation controller or a domestic appliance, a toy, a robot, an audio player, a video player, or a mobile telephone, and a smartphone.

* * * * *

UNITED STATES PATENT AND TRADEMARK OFFICE
CERTIFICATE OF CORRECTION

PATENT NO. : 11,489,534 B1
APPLICATION NO. : 17/498183
DATED : November 1, 2022
INVENTOR(S) : Lee et al.

It is certified that error appears in the above-identified patent and that said Letters Patent is hereby corrected as shown below:

In the Specification

1. In Column 4, Line 16, delete "digital-to-analog (DAC)" and insert -- digital-to-analog converter (DAC) --, therefor.

2. In Column 4, Line 34, delete "digital-to-analog (DAC)" and insert -- digital-to-analog converter (DAC) --, therefor.

3. In Column 5, Line 11, delete "truth table of showing" and insert -- truth table showing --, therefor at each occurrence throughout the patent.

4. In Column 5, Line 52, delete "FIG. 20;" and insert -- FIG. 19; --, therefor.

5. In Column 5, Line 53, delete "is schematic" and insert -- is a schematic --, therefor.

6. In Column 5, Line 57, delete "DESCRIPTION" and insert -- DETAILED DESCRIPTION --, therefor.

7. In Column 5, Line 66, delete "DAC which each" and insert -- DAC with each --, therefor.

8. In Column 7, Line 36, delete "switched round" and insert -- switched around --, therefor.

9. In Column 7, Line 46, delete "LSB word (D3 to D1)" and insert -- LSB word (D4 to D1) --, therefor.

10. In Column 8, Line 8, delete "odd rows" and insert -- even rows --, therefor.

11. In Column 8, Line 54, delete "tow decoder" and insert -- row decoder --, therefor.

12. In Column 8, Line 61, delete "some embodiments" and insert -- some embodiments, --, therefor.

Signed and Sealed this
Fourteenth Day of March, 2023

Katherine Kelly Vidal
*Director of the United States Patent and Trademark Office*

13. In Column 9, Line 2, delete "combinational logic 1002" and insert -- combinational logic circuit 1002 --, therefor.

14. In Column 9, Line 9, delete "combinational logic 1102" and insert -- combinational logic circuit 1102 --, therefor.

15. In Column 9, Line 16, delete "combinational logic 1002, 1102," and insert -- combinational logic circuits 1002, 1102, --, therefor.

16. In Column 9, Lines 18-19, delete "switch 606, 608." and insert -- switch 606, 706. --, therefor.

17. In Column 9, Lines 49-50, delete "column and row decoders 506C, 506C" and insert -- column and row decoders 506C, 506R --, therefor.

18. In Column 10, Line 4, delete "odd rows" and insert -- even rows --, therefor.

19. In Column 10, Lines 37-38, delete "current source 208" and insert -- current source 1608 --, therefor.

In the Claims

20. In Column 14, Line 28, in Claim 11, delete "where the" and insert -- wherein the --, therefor.

21. In Column 15, Line 36, in Claim 21, delete "DAC architecture of claim 1," and insert -- The DAC architecture of claim 1, --, therefor.